United States Patent
Cotton et al.

(10) Patent No.: US 9,832,911 B2
(45) Date of Patent: Nov. 28, 2017

(54) AIR HANDLING UNIT AND METHOD OF OPERATING THE SAME

(71) Applicant: Airedale International Air Conditioning Ltd., Leeds (GB)

(72) Inventors: Patrick Cotton, Leeds (GB); David Wilks, Leeds (GB); Michael Parker, Consett (GB); Steven Charlton, Consett (GB)

(73) Assignee: Airedale International Air Conditioning Ltd., West Yorkshire (GB)

(*) Notice: Subject to any disclaimer, the term of this patent is extended or adjusted under 35 U.S.C. 154(b) by 0 days.

(21) Appl. No.: 14/878,307

(22) Filed: Oct. 8, 2015

(65) Prior Publication Data

US 2016/0106008 A1   Apr. 14, 2016

Related U.S. Application Data

(60) Provisional application No. 62/061,949, filed on Oct. 9, 2014.

(51) Int. Cl.
*F25B 29/00* (2006.01)
*F24H 3/02* (2006.01)
(Continued)

(52) U.S. Cl.
CPC ....... *H05K 7/20745* (2013.01); *F24F 5/0007* (2013.01); *F24F 5/0035* (2013.01);
(Continued)

(58) Field of Classification Search
CPC .............. F24F 13/04; F24F 2011/0004; F24F 2012/008; F24F 2011/0002; F24F 13/08;
(Continued)

(56) References Cited

U.S. PATENT DOCUMENTS 6,742,583 B2   6/2004   Tikka
8,583,289 B2   11/2013  Stack et al.
(Continued)

FOREIGN PATENT DOCUMENTS

| JP | 2011043291 | * | 3/2011 |
| KR | 100851500 | | 2/2008 |
| WO | 2013184673 | | 12/2013 |

OTHER PUBLICATIONS

Translation of Japanese Patent Document JP 2011043291 entitled Translation—JP 2011043291.*

(Continued)

*Primary Examiner* — Len Tran
*Assistant Examiner* — Paul Alvare
(74) *Attorney, Agent, or Firm* — Michael Best & Friedrich LLP (57) ABSTRACT

An air handling unit, particularly for data center cooling, operates to cool a flow of return air from a conditioned space using a flow of ambient air. The return air is recirculated to the conditioned space as supply air. The flow of ambient air can be adiabatically cooled to a lower temperature to provide additional cooling. A flow of makeup air can be joined with the cooled return air to form the supply air, and can be sourced from the ambient environment directly or from the heated flow of ambient air.

7 Claims, 6 Drawing Sheets

(51) Int. Cl.

| | |
|---|---|
| *F24F 11/04* | (2006.01) |
| *H05K 5/00* | (2006.01) |
| *F24F 7/00* | (2006.01) |
| *F24F 13/00* | (2006.01) |
| *F25D 17/08* | (2006.01) |
| *H05K 7/20* | (2006.01) |
| *F24F 5/00* | (2006.01) |
| *F24F 12/00* | (2006.01) |
| *F24F 13/02* | (2006.01) |
| *F24F 13/08* | (2006.01) |
| *F24F 11/00* | (2006.01) |

(52) U.S. Cl.
CPC .......... *F24F 12/001* (2013.01); *F24F 12/006* (2013.01); *F24F 13/02* (2013.01); *F24F 13/08* (2013.01); *H05K 7/20836* (2013.01); *F24F 2011/0002* (2013.01); *Y02B 30/542* (2013.01); *Y02B 30/563* (2013.01)

(58) Field of Classification Search
CPC . F24F 13/02; H05K 7/20745; H05K 7/20836; F25D 17/06
USPC .......... 165/54, 248, 249, 252; 454/184, 237; 62/412
See application file for complete search history.

(56) References Cited

U.S. PATENT DOCUMENTS

| | | | |
|---|---|---|---|
| 8,721,409 | B1 | 5/2014 | Morales |
| 2010/0218919 | A1* | 9/2010 | Shibata ................. F24F 12/006 165/104.34 |
| 2012/0087086 | A1* | 4/2012 | Kok ..................... F24F 11/0012 361/679.47 |
| 2012/0167610 | A1 | 7/2012 | Dunnavant |
| 2012/0168119 | A1* | 7/2012 | Dunnavant ............... F24F 3/14 165/59 |
| 2012/0171943 | A1 | 7/2012 | Dunnavant |
| 2012/0298334 | A1 | 11/2012 | Madaffari et al. |
| 2013/0010423 | A1 | 1/2013 | Carlson |
| 2013/0023196 | A1 | 1/2013 | Fisher et al. |
| 2013/0269385 | A1* | 10/2013 | Takahashi .......... H05K 7/20745 62/513 |
| 2014/0251581 | A1 | 9/2014 | Williams |

OTHER PUBLICATIONS

Brent D. Elieson; Ambient Air Cooling; The Data Center Journal; Jun. 11, 2012; http://www.datacenterjournal.com/facilities/ambient-air-cooling/.

International Search Report and Written Opinion for Application No. PCT/GB2015/052235 dated Jan. 2, 2016 (16 pages).

* cited by examiner

AIR HANDLING UNIT AND METHOD OF OPERATING THE SAME

CROSS-REFERENCE TO RELATED APPLICATIONS

This application claims priority to U.S. Provisional Patent Application No. 62/061,949 filed Oct. 9, 2014, the entire contents of which are hereby incorporated by reference herein.

BACKGROUND

The present invention relates to air handling units, and particularly relates to air handling units used in data center cooling.

Data centers present unique and challenging thermal management concerns. As computing power density has continued to increase, and as the world's desire for data has continued to grow, the infrastructure that handles the storage and access to electronic data has increasingly been concentrated in dedicated data centers. Such data centers typically consist of large rooms or buildings housing electronics racks filled with data servers and associated equipment used to provide data access for computer users distributed around the world. These data centers consume tremendous amounts of electrical power, most of which is dissipated as heat by the electronics housed within the electronics racks. The electronic components themselves are prone to failure at elevated temperatures, and the proper regulation of the temperature of the components by managing the removal of this large quantity of generated heat is consequently of great concern.

This thermal management challenge is quite different from the challenges associated with the thermal management of conditioned spaces for human comfort, as may be found in buildings or spaces of similar size, such as office building and the like. In buildings and spaces where human occupancy is relatively high, emphasis is generally placed on providing adequate ventilation air in order to replenish oxygen, remove carbon dioxide, and in general avoid the accumulation of "stale" air. In contrast, data centers tend to have relatively low human occupancy but a substantially greater amount of heat being generated. Temperature and humidity levels are of greater concern to data center operators, and rather stringent industry standards for these have been developed. The traditional solution to these challenges has been to minimize the rate of air replacement within the data center, and to instead recirculate the air within the data center while removing the accumulated heat by transferring that heat to a cooling circuit. Such a cooling circuit typically uses a coolant such as refrigerant or chilled water to remove the heat from the air being circulated inside the data center, after which the coolant is routed to an external location where the heat is transferred to the environment.

While such systems function well for their intended purpose, they do have certain drawbacks. The substantial quantity of heat must be transferred at least twice—first from the internal air to the coolant, and then again from the coolant to the ambient air—which creates inherent inefficiencies. When chilled water is used, the heat is often transferred a third time, with an intermediate transfer of the heat from the chilled water to a separate refrigerant loop. All of these additional transfers of heat reduce the amount of time that such a cooling system can be operated without a power-consuming mechanical system, such as a vapor-compression refrigeration system, while still ensuring that the temperature of the coolant is both sufficiently below the desired internal space temperature and sufficiently above the ambient air temperature so that the desired rate of heat removal is achieved.

SUMMARY

According to an embodiment of the invention, an air handling unit includes a first inlet to receive a flow of return air from a conditioned space, a first outlet to deliver a flow of supply air to the conditioned space, a second inlet to receive a flow of ambient cooling air, and a second outlet to expel the flow of ambient cooling air. A first air flow path extends between the first inlet and the first outlet, and a second air flow path extends between the second inlet and the second outlet. An air to air heat exchanger is arranged along both the first and the second flow paths to transfer heat from the flow of return air to the flow of ambient cooling air.

In some embodiments, a make-up air section is fluidly coupled to the first air flow path, and the flow of supply air includes both the flow of return air and ambient air received through the make-up air section. In some such embodiments the make-up air section includes a first make-up air inlet configured to receive ambient air from external to the air handling unit, and a second make-up air inlet configured to receive ambient air from the second air flow path.

In some embodiments, one or more supply air blowers are arranged along the first air flow path between the air to air heat exchanger and the first outlet, and one or more exhaust air blowers are arranged along the second air flow path between the air to air heat exchanger and the second outlet. In some such embodiments, make-up air enters the first air flow path upstream of the plurality of supply air blowers.

In some embodiments, the air handling unit also includes a mechanical cooling system with an evaporator coil arranged along the first air flow path and a condenser coil arranged along the second flow path.

According to another embodiment of the invention, an air handling unit has an enclosure defining a rectangular prism. A return air inlet is arranged in a first quadrant of the enclosure, a supply air outlet is arranged in a second quadrant of the enclosure opposite the first quadrant, an ambient cooling air inlet is arranged in a third quadrant of the enclosure, and an ambient cooling air outlet is arranged in a fourth quadrant of the enclosure opposite the third quadrant. A cross-flow air to air heat exchanger is centrally located within the enclosure. The second quadrant and the third quadrant are located in the lower half of the enclosure, and the first quadrant and the fourth quadrant are located in the upper half of the enclosure In some embodiments, the cross-flow air to air heat exchanger has a first set of flow passages extending between the first quadrant and the second quadrant, and a second set of flow passages extending between the third quadrant and the fourth quadrant. The first set of flow passages and the second set of flow passages are alternatingly arranged in the heat exchanger.

In some embodiments a mechanical cooling system is provided, with an evaporator coil located within the second quadrant and a condenser coil located within the fourth quadrant. In some embodiments a make-up air section is arranged between the second quadrant and the fourth quadrant.

According to yet another embodiment of the invention, a method of operating an air handling unit includes receiving a flow of return air into an air handling unit from a space being conditioned, directing that flow of return air through a first set of passages in a heat exchanger, receiving a flow of ambient air into the air handling unit, directing that flow of ambient air through a second set of passages in the heat exchanger, transferring heat from the flow of return air to the flow of ambient air within the heat exchanger, blending a flow of make-up air into the cooled return air to produce a flow of supply air, and directing the flow of supply air from the air handling unit and into the space being conditioned.

In some embodiments the flow of ambient air is adiabatically cooled before being directed through the heat exchanger.

In some embodiments, the method also includes flowing a refrigerant at a relatively low pressure through an evaporator coil, directing the cooled return air over the evaporator coil to cool the return air and vaporize the refrigerant, compressing the refrigerant from the relatively low pressure to a relatively high pressure, flowing the relatively high pressure refrigerant through a condenser coil, directing the flow of ambient air over the condenser coil to condense the refrigerant, expanding the condensed refrigerant to the relatively low pressure, and returning the refrigerant to the evaporator coil.

In some embodiments, the ambient temperature of the air surrounding the air handling unit is measured. Based upon that measurement, the flow of make-up air is selected to be either heated ambient air or unheated ambient air. In some embodiments, when the flow of make-up air is selected to be heated ambient air, a make-up air flow path between the heated ambient air downstream of the heat exchanger and the inlet of supply air blowers is established by opening one flow control device and closing another flow control device.

DETAILED DESCRIPTION

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Figure 1:
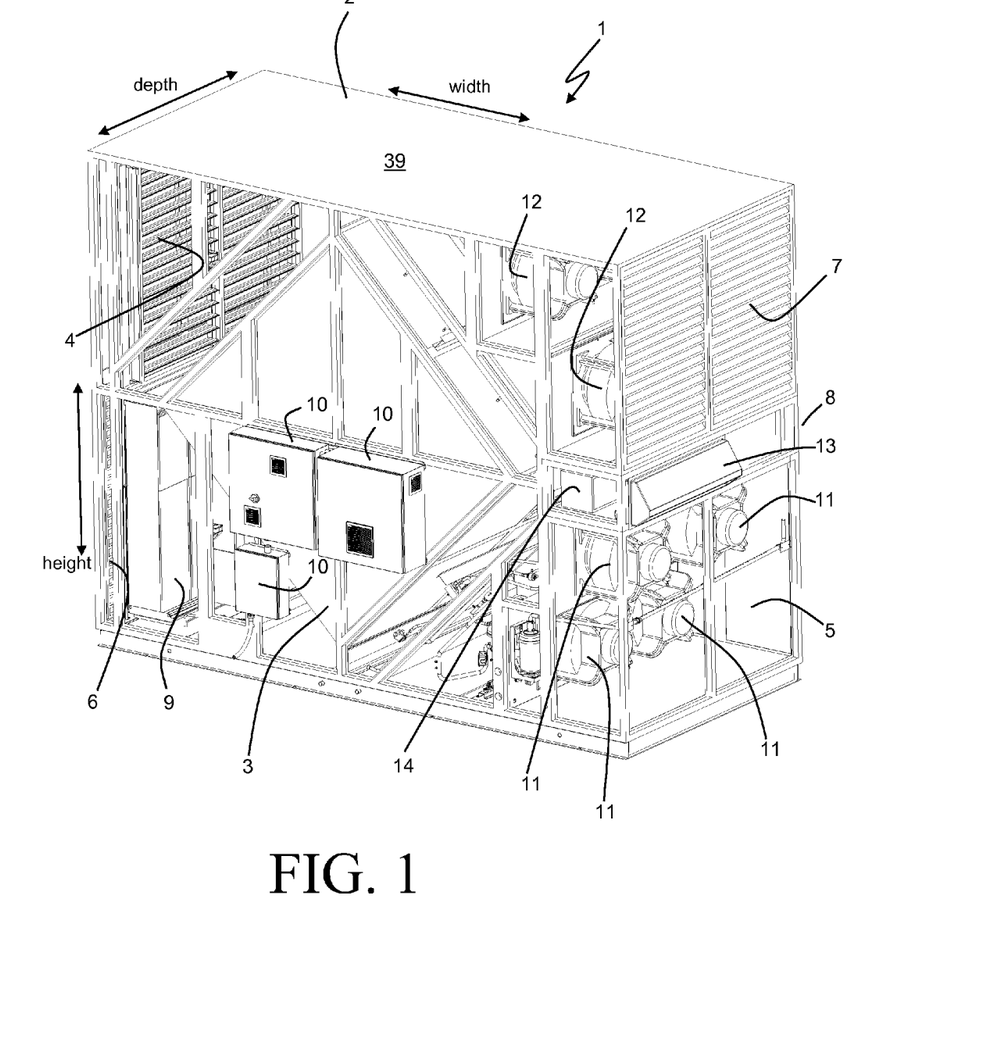
FIG. 1 is a perspective view of an air handling unit according to an embodiment of the invention, with certain components removed for clarity.
Figure 2:
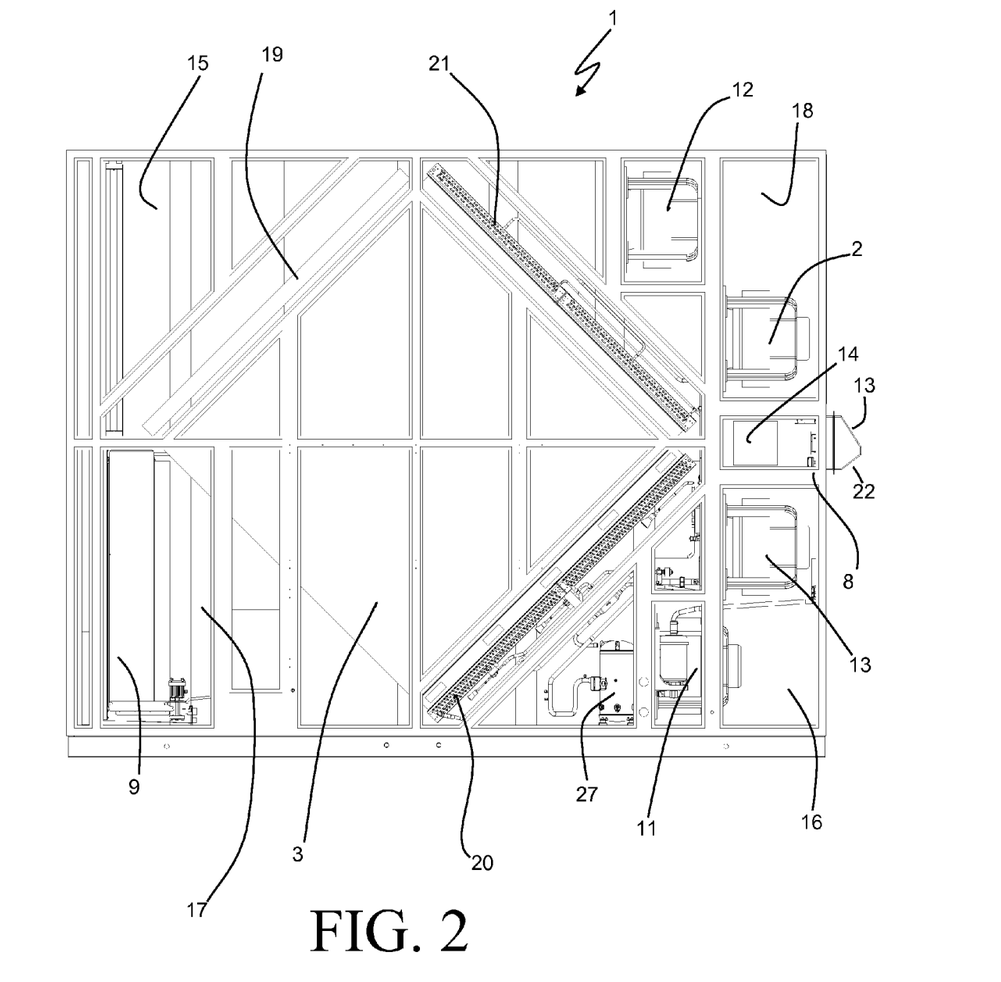
FIG. 2 is an elevation view of the air handling unit of FIG. 1.

An air handling unit 1 according to some embodiments of the invention is depicted in FIGS. 1-2. Certain of the exterior panels have been removed in the interest of clarity, as have certain internal components, so that pertinent characteristics of the invention can be best described. The air handling unit 1 can find particular utility in providing properly conditioned ventilation air to the interior of a building, and especially provides advantages when used to cool and recirculate cooling ventilation air for a data center.

Separated flow paths extend through the air handling unit 1 for a flow of recycled return air 25 to be received from a conditioned space within a building, cooled, and returned to that conditioned space, and for a flow of cooling ambient air 26. Sensible heat exchange between the two air flows is established by way of a heat exchanger 3 arranged within the air handling unit 1. Each of the air flows is ducted through the heat exchanger 3 in alternating flow channels so that the transfer of sensible heat between the return air 25 and the cooling ambient air 26 can be achieved without mixing of the flows.

Recycling the return air to the space to be conditioned provides certain advantages, among those being a reduction in the amount of filtration needed to ensure that undesirable pollutants are removed from the air stream. This can be of particular significance in the cooling of data centers, where avoidance of pollutants is especially critical in order to avoid equipment damage. In addition, the humidity level of the air being recirculated can be maintained without the need to humidify or dehumidify new, fresh air that may not be at the desired humidity level.

The exemplary air handling unit 1 is contained within an enclosure 2 having a substantially rectangular prism shape. For ease of discussion, the air handling unit 1 and the enclosure 2 will both be described with reference to "depth", "width", and "height" dimensions, those being the three dimensions of generally constant cross-section as shown in FIG. 1. In the exemplary embodiment of FIGS. 1-2, the enclosure 2 has approximate dimensions of 2.3 meters in the depth dimension, 4.75 meters in the width dimension, and 4 meters in the height dimension. However, it should be understood that the overall size of the enclosure 2 will necessarily vary with the air flow rate and heat removal requirements of the conditioned space to which the air handling unit 1 is applied, and that the general principles of the invention are readily scalable to both larger and smaller systems.

The enclosure 2 can be constructed using steel framing to support the internal components, with various side panels on the outer faces of the enclosure 2 (note that a large number of those side panels are note shown in FIGS. 1 and 2 so that internal components can be better described). At least some of those side panels can be removable to allow for access into the air handling unit 1 for service, maintenance, and the like. Electrical boxes 10 are mounted to the enclosure 2 to provide electrical power and controls for the air handling unit 1.

Figure 6:
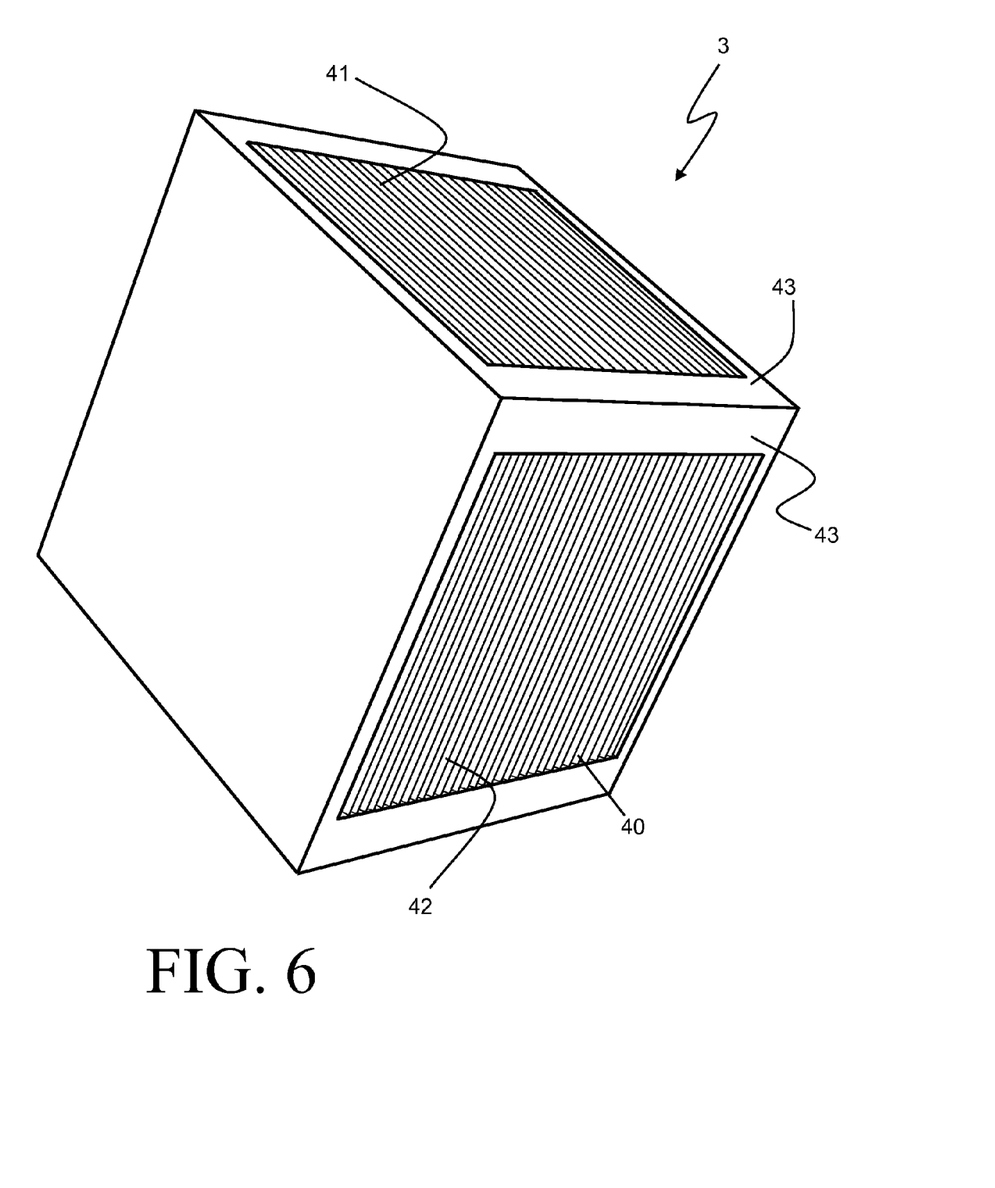
FIG. 6 is a perspective view of a heat exchanger of the embodiment of FIG. 1.

The enclosure 2 is subdivided into four quadrants, identified in FIGS. 2 as 15, 16, 17, and 18. Air movement between the four quadrants is predominantly prevented except through the heat exchanger 3, which is approximately centrally located within the enclosure 2. The heat exchanger 3 is approximately square in cross-section when viewed along the depth dimension, with four rectangular faces 43 extending along the depth dimension. Two such faces 43 can be seen in the perspective view of the heat exchanger 3 in FIG. 6, and it should be understood that similar such faces 43 are arranged opposite each of those two depicted faces 43. Plates 40 are arranged within the heat exchanger 3 along the depth direction to define a series of flow channels extending through the heat exchanger 3 between opposing faces 43. Selected opposing pairs of edges of each adjacent pair of plates 40 are joined together so that a flow path extending through the heat exchanger 3 in a desired direction is established between that pair of plates. In such a manner, flow channels 42, extending between the quadrant 15 and the quadrant 16, are arranged in alternating sequence with flow channels 41, extending between the quadrant 17 and the quadrant 18, thus creating a cross-flow heat exchanger. During operation of the air handling unit 1, heat is transferred through the plates 40 between a flow of air 25 passing through the channels 42 and a flow of air 26 passing through the channels 41. To that end, it is desirable that the plates 40 be constructed of a material having a relatively high thermal conductivity, such as, for example, aluminum.

Multiple supply air blowers 11 (four are shown in the exemplary embodiment) are located within the quadrant 16, and during operation of the air handling unit 1 the supply air blowers 11 operate to draw return air 25 into the air handling unit 1 through an inlet 4. The inlet 4 is provided in the quadrant 15, and the air being drawn in through the inlet 4 is further drawn through the channels 42 of the heat exchanger 3 and into the quadrant 16. Optional air filters 19 can be provided in the quadrant 15 directly upstream of the heat exchanger 3 in order to prevent particulates that may have been carried into the air handling unit 1 with the return air 25 from fouling the heat exchanger 3. The supply air blowers 11 are arranged so that the air entering into the quadrant 16 is drawn into the supply air blowers 11 and is expelled therefrom at an elevated pressure, to be discharged from the air handling unit 1 as supply air 28 through an outlet 5.

Multiple exhaust air blowers 12 are similarly arranged within the quadrant 18. During operation of the air handling unit 1, the exhaust air blowers 12 draw a flow of ambient cooling air 26 into the air handling unit 1 through an inlet 6. The inlet 6 is provided in the quadrant 17, and the air being drawn in through the inlet 6 is further drawn through the channels 41 of the heat exchanger 3 and into the quadrant 18. The air 26 is drawn into the exhaust air blowers 12 and is expelled from the air handling unit through the outlet 7.

The description of the air movers 11 and 12 as "blowers" is intended to be inclusive of other air movers which might similarly be employed to impel the movement of either the ambient air or the return air through the air handling unit 1. Such air movers might additionally or alternatively be referred to as "fans".

Figure 3:
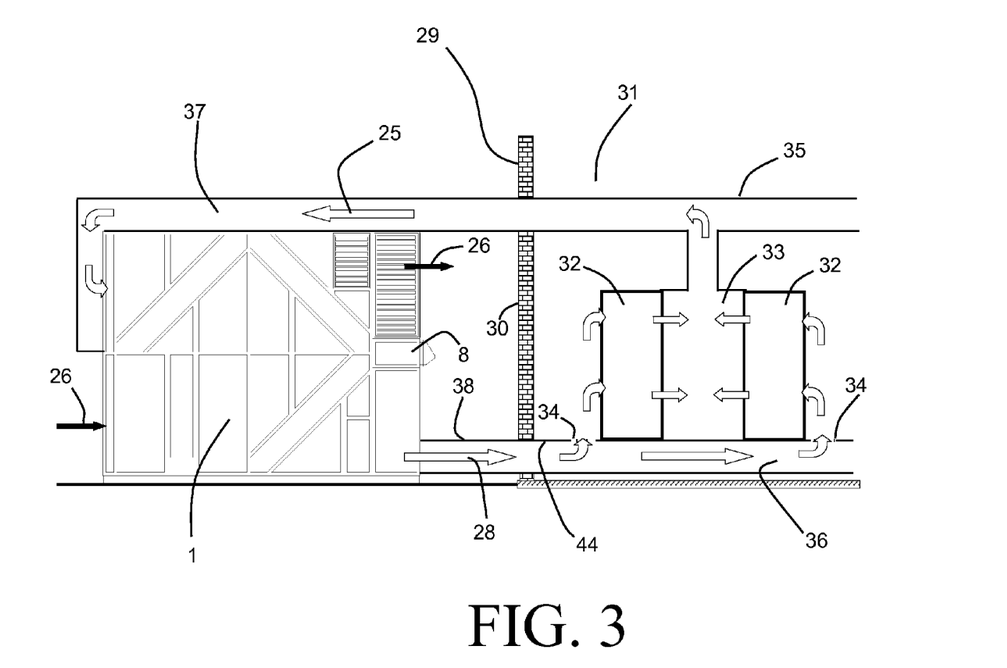
FIG. 3 is an elevation view of the air handling unit of FIG. 1 in an installed condition.
Figure 4:
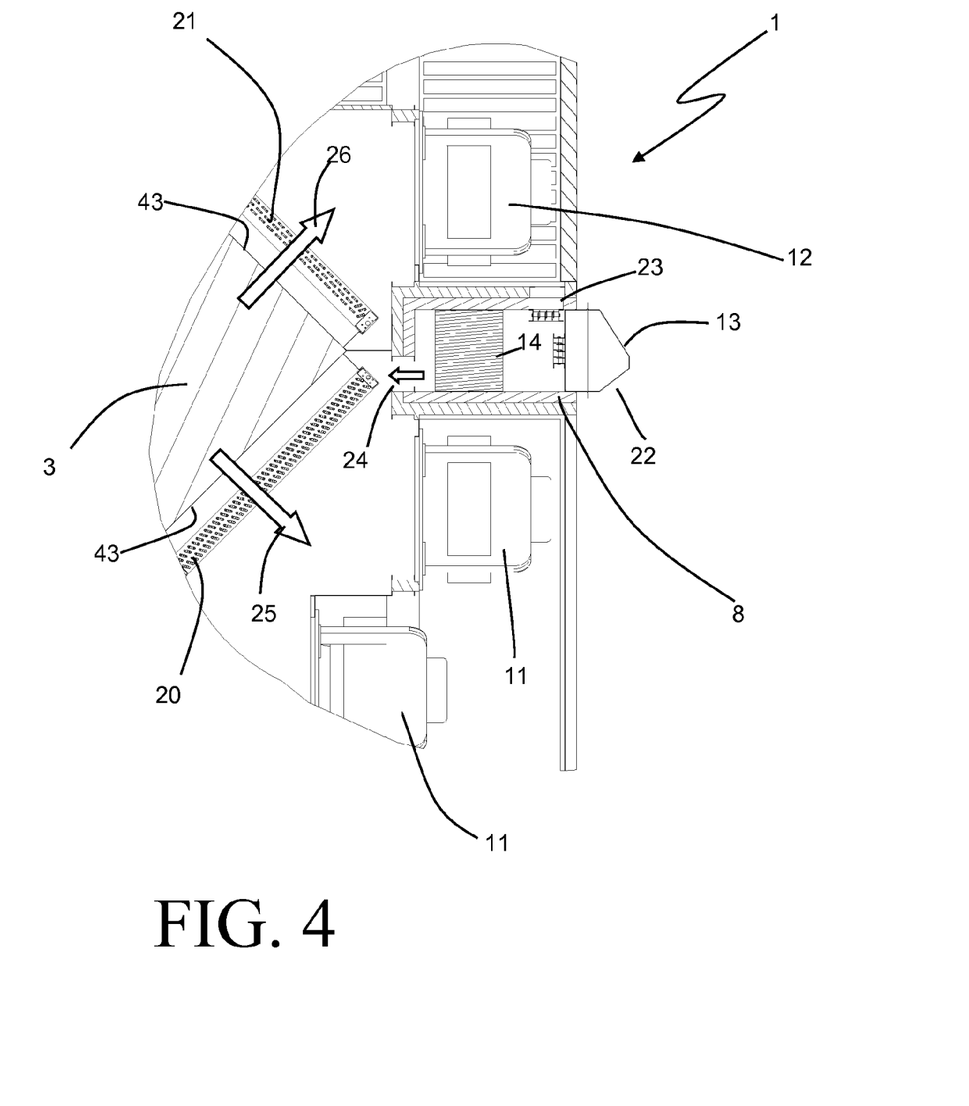
FIG. 4 is a partial sectional view showing a portion of the air handling unit of FIG. 2 in greater detail.

Turning now to FIG. 3, the operation of an installed air handling unit 1 in one representative embodiment will be described. In the embodiment of FIG. 3, the air handling unit 1 is installed adjacent to a building 29 in order to maintain temperature control within a conditioned space 31 interior to the building 29. The representative embodiment depicted in FIG. 3 is a data center cooling application, although it should be understood that the air handling unit 1 can be similarly applied to other types of applications.

The space 31 being conditioned by the air handling unit 1 houses multiple electronics racks 32. The electronics racks 32 can be used to house rack-mounted servers, power supplies, and other electrical or electronic equipment necessary for the operation of a data center. The electronics racks 32 are supported on a raised floor 44, below which is a floor void 36. The floor void 36 is a generally hollow space that is operatively coupled to outlet 5 of the air handling unit 1 by way of ductwork 38. The ductwork 38 extends from the outlet 5 through the outer wall 30 of the building 29 to connect to the floor void 36. The generally hollow space of the floor void 36 may contain electrical wiring, structural support members, and the like, but is generally open to the movement of air.

Floor vents 34 are provided at select locations of the raised floor 44 in order to allow for movement of supply air 28 received from the air handling unit 1 by way of the floor void 36 through the raised floor 44 and into the space 31. The floor vents 34 can be arranged (by, for example, replacing solid floor tiles with perforated floor tiles at select locations) to be immediately adjacent to the electronics racks 32 so that cooling air can be supplied to those racks 32. The cooling supply air 28 is drawn through the electronics racks 32 by blowers provided within the racks 32 and/or by the suction effect of the supply air blowers 12 in the air handling unit 1, providing for air cooling of the electronics housed within the electronics racks 32 as the air passes through.

In the exemplary embodiment, the electronics racks 32 are arranged in opposing rows separated by an enclosed space 33, a configuration commonly referred to as hot aisle containment. Such a configuration provides certain benefits in cooling the electronics contained within the electronics racks 32 by collecting and removing the heated air from the data center so that it can be adequately cooled before recirculating back to the conditioned space 31. The heated air is ducted from the hot aisle 33 to the return air inlet 4 of the air handling unit 1 as return air 25, by way of a duct 35 that extends through the wall 30. While a hot aisle containment configuration is depicted, it should be understood that any other suitable configuration can alternatively be deployed, such as, for example, cold aisle containment (wherein the floor vents deliver supply air to an enclosed cold aisle situated between opposing rows, and the heated air is collected directly from the space), or no containment.

As the return air 25 enters the air handling unit 1, it passes through the channels 42 of the heat exchanger 3 as previously described so that the heat from the electronics, which was transferred to the air as it passed through the electronics cabinets 32, can be removed prior to the air being delivered back to the conditioned space 31. Ambient cooling air 26 is drawn into the air handling unit 1 through the inlet 6 for this purpose. Under some operating conditions, the ambient air 26 is at a sufficiently low temperature for cooling the return air 25 to the desired supply air temperature. For example, a typical representative temperature of the supply air 28 and of the return air 25 can be twenty-six degrees Celsius and thirty-five degrees Celsius, respectively. This means that when ambient air temperatures are below the targeted supply air temperature of twenty-six degrees Celsius, the return air 25 can, at least in theory, be cooled to the desired supply air temperature through exchanging heat to the ambient air in the heat exchanger 3. In actuality, the temperature of the cooling air passing through the heat exchanger 3 would need to be sufficiently below the desired supply air temperature in order to account for inherent limitations in the effectiveness of the heat exchanger 3. Nonetheless, in many environments the ambient temperature will be sufficiently low to accomplish such cooling over at least a substantial portion of the year.

In order to provide the requisite cooling over those portions of the year when the ambient temperature is not sufficiently low, the air handling unit can be provided with an adiabatic cooling system 9 arranged along the cooling air flow path upstream of the heat exchanger 3 in the quadrant 17. The adiabatic cooling system 9 suppresses the temperature of the flow of ambient air adiabatically (i.e. without the removal of heat) by introducing water into the airstream through evaporation, so that sensible heat energy within the air is absorbed as latent heat energy in the evaporated water.

The principle of adiabatic cooling or evaporative cooling is fairly well known, and relies on the relatively high enthalpy of vaporization of water. At any given temperature and pressure, air will have a maximum, or saturation, capacity for water vapor content. The water vapor content of air is often expressed in terms of a humidity ratio, or the mass ratio of water vapor to dry air, and the degree of saturation (often referred to as the percentage humidity) can be calculated by dividing the actual humidity ratio by the humidity ratio at saturation for that given temperature and pressure. Ambient air typically has a percentage humidity that is less than 100%, i.e. a moisture content that is below its saturation level. Exposing a flow of unsaturated air to liquid water (as, for example, a spray of small droplets or a film of liquid water) causes some of the water to be evaporated into the air, and the humidity ratio of the air will be increased to a level that is closer to saturation. The latent heat required to convert the liquid water to water vapor is derived from the sensible heat of the air itself, and this conversion of heat causes a drop in the temperature of the air.

The achievable temperature depression effected by the adiabatic cooling system 9 is highly dependent on the humidity of the ambient air. Depressions of as much as twelve degrees centigrade have been found to be achievable under certain conditions, enabling the air handling unit 1 to deliver the supply air 28 at its targeted temperature even when ambient temperatures are as high as thirty-five degrees Celsius.

The adiabatic cooling system 9 depicted in the illustrated embodiments is of a wetted media type. In such a system, liquid water is circulated using a pump in order to continuously moisten a media which is permeable to air. The ambient air flow 26 is drawn through the media by the suction effect of the exhaust air blowers 12, and is simultaneously filtered by the media and evaporatively cooled by the water. In other embodiments, alternative types of adiabatic cooling systems such as misters and spray humidifiers may be used in place of the wetted media system.

The method of cooling the return air as described can be properly referred to as indirect evaporative cooling, as the water being used to achieve the evaporative cooling is not introduced directly into the return air stream itself. This can be distinguished from more conventional direct evaporative cooling systems, wherein the evaporative cooling effect is achieved by evaporating water directly into the return air stream. The indirect evaporative cooling system of the present invention has certain advantages over the direct evaporative cooling system in avoiding the issues associated with introducing excess humidity and contaminants, including potentially dangerous pathogens (for example, legionella bacteria and the like), into the space being conditioned.

Under certain operating conditions it may be necessary to provide additional cooling means in order to reduce the temperature and/or the humidity of the supply air 28 to a suitable condition. The cooling provided by the ambient air 26 can be augmented through the use of a mechanical cooling system that can optionally be integrated into the air handling unit 1. Such a mechanical cooling system can operate on a vapor compression cycle, whereby a vapor phase refrigerant is compressed to a high pressure, cooled and condensed by the ambient air to a sub-cooled liquid, expanded to a low pressure, and vaporized to a low pressure vapor by absorbing heat from the return air 25.

As part of the mechanical cooling system, an evaporator 20 is arranged at the exit face of the heat exchanger 3 in the quadrant 16. As the return air 25 exits the flow channels 42 of the heat exchanger 3, it passes through the evaporator 20 in order to further cool the return air. The low-pressure refrigerant is circulated through the evaporator 20, and is vaporized by absorbing heat from the return air 25.

The vaporized refrigerant is routed from the evaporator 20 to a compressor 27, which compresses the refrigerant to a high pressure vapor having a saturation temperature that is substantially higher than the ambient temperature. The refrigerant is subsequently directed to a condenser 21 arranged at the exit face of the heat exchanger 3 in the quadrant 18. There, the ambient air 26 exiting the flow channels 41 of the heat exchanger 3 passes through the condenser 21. By virtue of the elevated saturation temperature of the high pressure refrigerant, the heated ambient air 26 is still at a sufficiently low temperature so as to be able to cool the refrigerant passing through the condenser 21. The ambient air 26 removes heat from the refrigerant, thereby condensing it to a sub-cooled liquid. The liquid refrigerant can then be expanded back to the low pressure and delivered back to the evaporator 20 to complete the cycle.

Both the evaporator 20 and the condenser 21 are depicted in the exemplary embodiment as round-tube-plate-fin style heat exchangers. However, it should be understood that other types of heat exchangers, such as, for example, parallel flow style heat exchangers, can alternatively be used.

Advantages can be found in placing the quadrant 17, housing the adiabatic cooling system 9, and the quadrant 16, housing the evaporator 20, in the bottom half of the enclosure 2. This arrangement allows for easy drainage of any liquid water that is either carried through by the ambient air 26 as it passes through the adiabatic cooling system 9, or condensed from the return air stream 25 as it passes through the evaporator 20. Sloped drains can be provided in the bottom of one or both quadrants 16, 17 in order to effect the removal of such liquid water. Additionally, such an arrangement places the two warmer quadrants 15 and 18 at a higher location than the two cooler quadrants 16 and 17. This can provide some efficiency improvements in that it complements the natural buoyancy effects of the air, thus mitigating any potential efficiency losses due to natural convection.

In another aspect of the invention, a make-up air section 8 can be provided within the air handling unit 1 in order to provide make-up air to the controlled environment as part of the supply air 28. In many applications it is desirable for the space 31 to be maintained at some positive pressure relative to the ambient environment, so that infiltration into the space of undesirable pollutants or contaminants from the ambient environment can be minimized or avoided. During operation of the air handling unit 1, some air being supplied to the controlled environment may be lost to the environment through leaks. The lost air must then be compensated for through the addition of so-called make-up air. A typical, representative value for the amount of make-up air that may be required in a data center application, such as the one depicted in FIG. 3, is two to three percent of the total amount of supply air.

Figure 5:
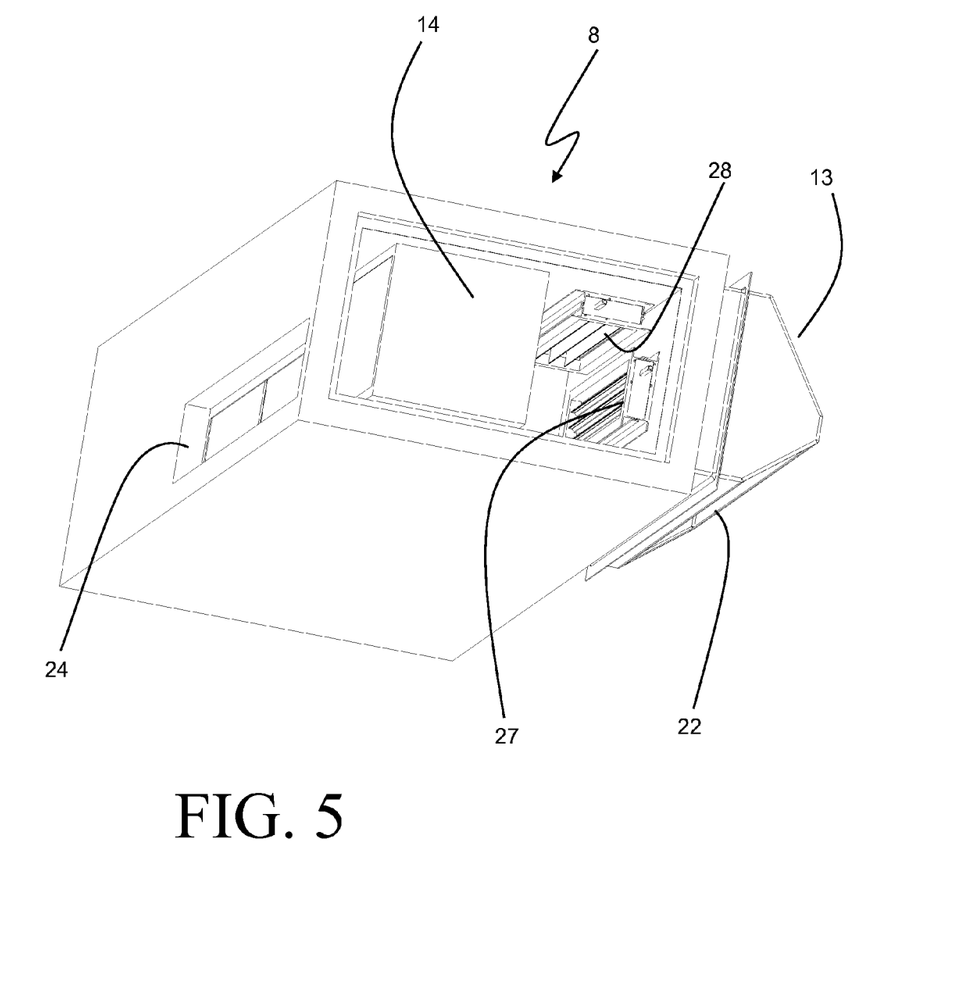
FIG. 5 is a perspective view of a make-up air section of the embodiment of FIG. 1.

The make-up air section 8 is located between the quadrants 16 and 18, and includes an outlet 24 that is fluidly connected to the quadrant 16 to deliver make-up air thereto. At least one, and preferably two, air inlets to the make-up air section 8 are provided in fluid communication with the outlet 24. A first air inlet 22 is provided by way of an inlet hood 13 arranged at an outer wall of the enclosure 2 to allow for ambient air from outside of the air handling unit 1 to be provided as make-up air. A second air inlet 23 can be provided to, under certain operating conditions, allow for a portion of the flow of ambient cooling air 26 to be diverted as make-up air. Controllable motorized flow control devices (depicted in the exemplary embodiment as louvers 27, 28) can be provided at the inlets 22, 23 respectively in order to allow for selection between the two air inlets. Other types of flow control devices that might alternatively be used include shutters, dampers, baffles, and the like. An air filter 14 is provided within the make-up air section 8 upstream of the outlet 24 and downstream of both inlets 22, 23 so that the make-up air can be adequately filtered before becoming part of the supply air 28 to the controlled space.

By placing the outlet 24 at a location that is upstream of the supply air blowers 11, the suction of the supply air blowers 11 can be used to effect the flow of make-up air into the quadrant 16. This avoids the need to employ a separate air mover in order to provide the flow of make-up air, thus providing a simplified system and increased operational efficiency. In addition, the inlet 23 is provided on the outlet side of the exhaust air blowers 12, so that the pressurizing effects of the exhaust air blowers 12 can assist in directing make-up air to the outlet 24 when the louvers 27 are closed and the louvers 28 are open.

Under the majority of operating conditions, the make-up air can preferably be sourced through the inlet 22 by operating with the louvers 27 open and with the louvers 28 closed. However, problems can be encountered with such operation when the ambient temperature is very cold. During such conditions, frost and ice can build up on the filter 14, leading to reduced flow of make-up air and even complete blockage of air flow through the filter 14.

In order to avoid such an undesirable result, the ambient air temperature is monitored using a temperature sensor. Such a temperature sensor may be located outside of the enclosure 2, or it may be located within the enclosure 2, such as in the quadrant 17 where ambient air enters into the enclosure 2. Under conditions where the ambient temperature is at a temperature that is near to or below freezing, a controller operates to reverse the louver settings so that the louvers 27 are closed and the louvers 28 are open. Such an operating condition allows for the make-up air to be sourced from the heated ambient cooling air 26, which, having passed through the heat exchanger 3, has been warmed to a suitable temperature to avoid freezing of the filter 14 from occurring. Advantageously, under such operating conditions the adiabatic cooling system 9 would not need to be in operation, so the make-up air would not be encumbered by undesirable excess humidity. The need for heating (using electrical means, for example) of the make-up air during cold conditions is thereby avoided, providing additional operational efficiencies. As illustrated in the figures, the make-up air section 8 can be provided as a replaceable module, and can be optional in installations where make-up air is already available through other means.

Various alternatives to the certain features and elements of the present invention are described with reference to specific embodiments of the present invention. With the exception of features, elements, and manners of operation that are mutually exclusive of or are inconsistent with each embodiment described above, it should be noted that the alternative features, elements, and manners of operation described with reference to one particular embodiment are applicable to the other embodiments.

The embodiments described above and illustrated in the figures are presented by way of example only and are not intended as a limitation upon the concepts and principles of the present invention. As such, it will be appreciated by one having ordinary skill in the art that various changes in the elements and their configuration and arrangement are possible without departing from the spirit and scope of the present invention.

We claim:
1. An air handling unit comprising:
an enclosure defining a rectangular prism;
a return air inlet arranged in a first quadrant of the enclosure;
a supply air outlet arranged in a second quadrant of the enclosure opposite the first quadrant;
an ambient cooling air inlet arranged in a third quadrant of the enclosure;
an ambient cooling air outlet arranged in a fourth quadrant of the enclosure opposite the third quadrant; and
a cross-flow air to air heat exchanger generally centrally located within the enclosure, wherein the second quadrant and the third quadrant are located in the lower half of the enclosure and the first quadrant and the fourth quadrant are located in the upper half of the enclosure;
a make-up air section arranged between the second quadrant and the fourth quadrant;
a plurality of supply air blowers located within the second quadrant;
a plurality of exhaust air blowers located within the fourth quadrant;
a first make-up air flow path extending through the make-up air section from a first location within the fourth quadrant and downstream of the exhaust air blowers to a second location within the second quadrant and upstream of the supply air blowers; and
a second make-up air flow path extending through the make-up air section from the exterior of the enclosure to the second location.

2. The air handling unit of claim 1, wherein the cross-flow air to air heat exchanger includes a first plurality of flow passages extending between the first quadrant and the second quadrant, and a second plurality of flow passages alternatingly arranged with the first plurality of flow passages and extending between the third quadrant and the fourth quadrant.

3. The air handling unit of claim 1, further comprising an evaporative cooler located within the third quadrant.

4. The air handling unit of claim 1, further comprising a mechanical cooling system having an evaporator coil located within the second quadrant and a condenser coil located within the fourth quadrant.

5. The air handling unit of claim 1, wherein the first make-up air flow path is configured to direct ambient air from the fourth quadrant to the second quadrant, and the second make-up air flow path is configured to direct ambient air from outside of the enclosure to the second quadrant.

6. The air handling unit of claim 1, wherein air is directed along the first make-up air flow path by the plurality of exhaust blowers in at least some operating conditions, and wherein air is directed along the second make-up air flow path by the plurality of supply air blowers in at least some operating conditions.

7. The air handling unit of claim 1, further comprising:
a first flow control device for selectively blocking air flow along the first make-up air flow path;
a second flow control device for selectively blocking air flow along the second make-up air flow path; and
a controller operable to control the first and second flow control devices in order to select the source of make-up air.

\* \* \* \* \*